United States Patent
Wrench et al.

(10) Patent No.: US 10,559,578 B2
(45) Date of Patent: Feb. 11, 2020

(54) DEPOSITION OF COBALT FILMS WITH HIGH DEPOSITION RATE

(71) Applicant: Applied Materials, Inc., Santa Clara, CA (US)

(72) Inventors: Jacqueline S. Wrench, San Jose, CA (US); Jing Zhou, San Jose, CA (US); Fuqun Grace Vasiknanonte, Sunnyvale, CA (US); Jiang Lu, Milpitas, CA (US); Paul F. Ma, Santa Clara, CA (US); Nobuyuki Sasaki, Santa Clara, CA (US); Sree Rangasai V. Kesapragada, Union City, CA (US); Sang Ho Yu, Cupertino, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/995,693

(22) Filed: Jun. 1, 2018

(65) Prior Publication Data
US 2018/0350826 A1 Dec. 6, 2018

Related U.S. Application Data

(60) Provisional application No. 62/514,758, filed on Jun. 2, 2017.

(51) Int. Cl.
*H01L 21/00* (2006.01)
*H01L 27/11551* (2017.01)
*H01L 27/11578* (2017.01)
*H01L 21/285* (2006.01)
*H01L 21/8229* (2006.01)
*H01L 21/8239* (2006.01)
*H01L 21/822* (2006.01)

(52) U.S. Cl.
CPC .. *H01L 27/11551* (2013.01); *H01L 21/28556* (2013.01); *H01L 21/8221* (2013.01); *H01L 21/8229* (2013.01); *H01L 21/8239* (2013.01); *H01L 27/11578* (2013.01)

(58) Field of Classification Search
CPC ......... H01L 27/11551; H01L 21/28556; H01L 21/8221; H01L 21/8229; H01L 21/8239; H01L 27/11578
See application file for complete search history.

(56) References Cited

U.S. PATENT DOCUMENTS

| | | | | |
|---|---|---|---|---|
| 6,888,750 B2* | 5/2005 | Walker | ................. | H01L 21/822 257/E21.606 |
| 8,440,542 B2* | 5/2013 | Sekar | ................. | H01L 21/8221 257/287 |
| 8,686,428 B1* | 4/2014 | Sekar | ................. | H01L 21/8221 257/173 |

* cited by examiner

*Primary Examiner* — Richard A Booth
(74) *Attorney, Agent, or Firm* — Servilla Whitney LLC

(57) ABSTRACT

Embodiments of the invention provide methods of processing a substrate having a stack of spaced oxide layers with gaps between the oxide layers. A metallic nucleation layer is formed in the gaps and a cobalt film is deposited on the nucleation layer to form wordlines.

20 Claims, 1 Drawing Sheet

DEPOSITION OF COBALT FILMS WITH HIGH DEPOSITION RATE

CROSS-REFERENCE TO RELATED APPLICATIONS

This application claims priority to U.S. Provisional Application No. 62/514,758, filed Jun. 2, 2017, the entire disclosure of which is hereby incorporated by reference herein.

TECHNICAL FIELD

Embodiments of the disclosure relate to the deposition of cobalt films. More particularly, embodiments of the disclosure are directed to the deposition of metallic cobalt films as wordlines in three dimensional semiconductor devices.

BACKGROUND

Semiconductor and electronics processing industries continue to strive for larger production yields while increasing the uniformity of layers deposited on substrates having larger surface areas. These same factors in combination with new materials also provide higher integration of circuits per area of the substrate. As circuit integration increases, the need for greater uniformity and process control regarding layer thickness rises. As a result, various technologies have been developed to deposit layers on substrates in a cost-effective manner, while maintaining control over the characteristics of the layer.

V-NAND, or 3D-NAND, structures used in flash memory applications are vertically stacked NAND structures with a large number of cells arranged in blocks. Gate-last wordline formation is currently the mainstream process flow in 3D-NAND manufacturing. Prior to wordline formation, the substrate is a layered oxide stack supported by a memory string. The gap space is filled by tungsten using CVD or ALD. The top/sidewall of the memory stack is also coated with tungsten. The tungsten is removed from the top/sidewall of the stack by etch process (e.g., a reactive-ion etch (RIE) process or radical-based etch process) so that the tungsten exists only inside of the gap space and each tungsten fill is completely separated from other tungsten fills.

Fluorine in the tungsten films degrades the barrier performance in NAND especially after high temperature annealing. Additionally, with more layers in the NAND structure, low film resistivity becomes more important for device performance. Therefore, there is a need in the art for devices and methods for preparing devices with three-dimensional structures that has a lower film resistivity.

SUMMARY

One or more embodiments of the disclosure are directed to methods of processing a substrate. A substrate having a stack of spaced oxide layers with gaps between the oxide layers is provided. The stack has a top and sides. A metallic nucleation layer is deposited in the gaps. A cobalt film is deposited on the nucleation layer. The cobalt film fills the gaps and forms wordlines.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only a typical embodiment of the disclosure and are therefore not to be considered limiting of its scope, for the disclosure may admit to other equally effective embodiments.

DETAILED DESCRIPTION

Embodiments of the disclosure provide methods for depositing cobalt films on cobalt seed layers. The process of various embodiments uses vapor deposition techniques, such as an atomic layer deposition (ALD) or chemical vapor deposition (CVD) to provide cobalt films.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

One or more embodiments of the disclosure provide methods for cobalt film deposition at low temperatures with high deposition rates. Some embodiments of the disclosure provide methods with improved cobalt film nucleation. One or more embodiments use a cobalt precursor with relatively high vapor pressure and can provide high deposition rate at low temperature. Some embodiments provide control over the deposition rate from 1 Å/second to 20 Å/second. The cobalt film deposition may have different nucleation behaviors on different substrates.

Some embodiments of the disclosure provide methods for gapfill in 3D NAND structures using a metallic nucleation layer before cobalt deposition. The cobalt film can be deposited on the metallic nucleation layer without an air break or with a short air break.

Figure 1:
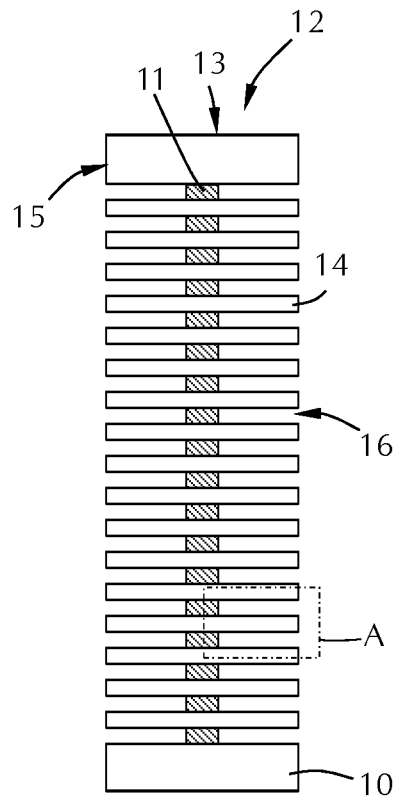
FIG. 1 shows a schematic representation of an electronic device structure in accordance with one or more embodiment of the disclosure.

FIG. 1 illustrates an embodiment of a 3D NAND structure showing a plurality of gaps between oxide layers. The gaps will have a metal film deposited therein to form the wordlines. FIGS. 2A through 2E show an expanded view of region A of FIG. 1 to illustrate an exemplary process for filling the gaps to form the wordlines in accordance with one or more embodiments of the disclosure.

The device of FIG. 1 shows a substrate 10 has a stack 12 of layers thereon. The substrate 10 can be any suitable substrate material and is not limited to being the same material as any of the individual layers. For example, in some embodiments, the substrate is an oxide, nitride or metal layer. The stack 12 has a plurality of oxide layers 14 that are spaced apart from each other to form gaps 16 between the oxide layers 14. The gaps can act as a shell or template for the wordline formation. The stack 12 has a top 13 and sides 15 which may be exposed.

The stack 12 can have any suitable number of oxide layers 14 or gaps 16. In some embodiments, there are greater than or equal to about 10, 20, 30, 40, 50, 60, 70, 80, 90 or 100 gaps 16 formed in the stack 12 that can be used to form an equal number of wordlines. The number of the gaps 16 is measured on either side of the memory string 11 that connects all of the individual oxide layers 14. In some embodiments, the number of gaps 16 is a multiple of 2. In some embodiments, the number of gaps is equal to $2^n$ where n is any positive integer. In some embodiments, the number of gaps 16 is about 96.

Figure 2A:
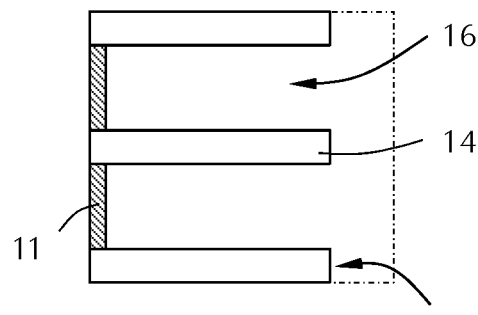
FIG. 2A shows an expanded view of region A of FIG. 1.
Figure 2B:
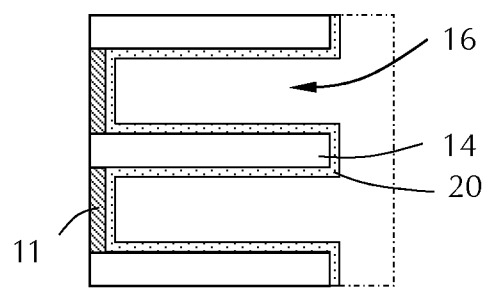
FIG. 2B shows an expanded view of region A of FIG. 1 after formation of a barrier layer in the gaps in accordance with one or more embodiment of the disclosure.

FIG. 2A shows expanded region A of FIG. 1. The oxide layers 14 and gaps 16 can be seen with memory string 11 bounding one side of the gap 16. FIG. 2B shows a barrier layer 20 formed on the oxide layers 14 and the memory string 11. In some embodiments there is no barrier layer between the oxide layers 14 and a nucleation layer. In some embodiments, the barrier layer 20 forms a boundary of the gap 16 as shown.

The barrier layer can be any suitable barrier material. In some embodiments, the barrier layer comprises titanium nitride. In some embodiments, the barrier layer consists essentially of titanium nitride. As used in this manner, the term "consists essentially of titanium nitride" means that the composition of the barrier layer is greater than or equal to about 95%, 98% or 99% titanium and nitrogen atoms, on an atomic basis. The thickness of the barrier layer can be any suitable thickness. In some embodiments, the barrier layer has a thickness in the range of about 20 Å to about 100 Å, or in the range of about 30 Å to about 50 Å. In some embodiments, the barrier layer has a thickness sufficient to form a continuous film. As used in this manner, the term "continuous film" means a film that has less than about 5%, 2% or 1% voids in the surface area of the film.

Figure 2C:
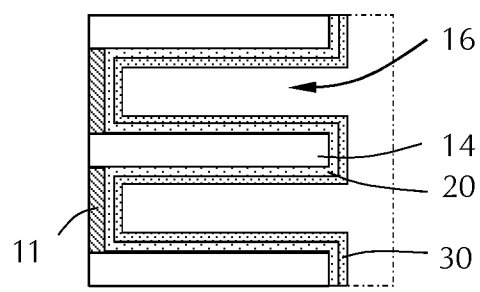
FIG. 2C shows an expanded view of region A of FIG. 1 after formation of a metallic nucleation layer in accordance with one or more embodiment of the disclosure.

Referring to FIG. 2C, a metallic nucleation layer 30 is deposited in the gaps 16. The metallic nucleation layer 30 of some embodiments comprises cobalt. In some embodiments, the metallic nucleation layer 30 consists essentially of cobalt. As used in this manner, the term "consists essentially of cobalt" means that the composition of the metallic nucleation layer 30 is greater than or equal to about 95%, 98% or 99% cobalt, on an atomic basis.

The metallic nucleation layer can have any suitable thickness. In some embodiments, the thickness of the metallic nucleation layer 30 is sufficient to form a continuous film. In some embodiments, the metallic nucleation layer 30 has a thickness in the range of about 30 Å to about 100 Å.

Deposition of the metallic nucleation layer 30 can be done by any suitable method. For example, the metallic nucleation layer 30 can be deposited by ALD or CVD. In some embodiments, depositing the metallic nucleation layer 30 comprises exposing the substrate to a first cobalt compound comprising a dicobalt hexacarbonyl acetyl compound and a first reactant to deposit a cobalt layer. In some embodiments, the first cobalt compound comprises dicobalt hexacarbonyl butylacetylene (CCTBA).

In some embodiments, the first cobalt compound and the first reactant are exposed to the substrate at the same time in a chemical vapor deposition reaction. In some embodiments, the first cobalt compound and the first reactant are exposed sequentially to the substrate in an atomic layer deposition type reaction.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed sequentially to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas sequentially.

The first reactant can be any suitable reactant that can reduce the first cobalt compound to cobalt metal. In some embodiments, the first reactant comprises one or more of hydrogen, hydrogen plasmas, alcohols, carboxylic acids, aldehydes, silanes, boranes, ammonia, hydrazine, hydrazine derivatives and combinations thereof.

Figure 2D:
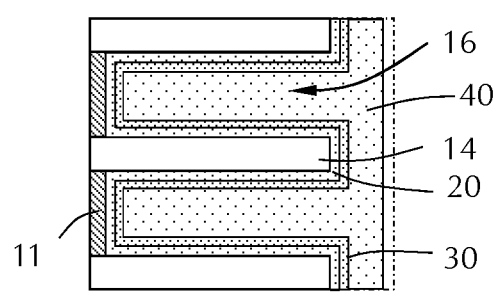
FIG. 2D shows an expanded view of region A of FIG. 1 after formation of a film on the nucleation layer in accordance with one or more embodiment of the disclosure.

Once the metallic nucleation layer 30 has been formed, a blanket or conformal deposition can be performed to fill the gap 16 to form the wordlines. In FIG. 2D, a cobalt film 40 is deposited on the metallic nucleation layer 30. In some embodiments, depositing the cobalt film comprises exposing the substrate to a second cobalt compound comprising one or more of cobalt tricarbonyl allyl or cobalt tricarbonyl nitrosyl and a second reactant.

The second reactant can be any suitable reactant that can form a cobalt film with the cobalt precursor. In some embodiments, the second reactant comprises one or more of $H_2$, $NH_3$, $H_2$ plasma or $NH_3$ plasma. In some embodiments, the second reactant is a mixture of hydrogen and ammonia.

The metallic nucleation layer 30 allows for the rapid deposition of a gapfill metal to form the wordlines. In some embodiments, the cobalt film has a deposition rate greater than or equal to about 1 Å per second. In some embodiments, the deposition rate of the cobalt film is greater than or equal to about 2, 3, 4, 5, 6, 7, 8, 9, 10, 12, 14, 16, 18 or 20 Å per second.

After deposition of the cobalt film, an optional annealing process can be performed to modify a property of the cobalt film. In some embodiments, annealing of the film occurs in the same processing chamber as the deposition of the film. In some embodiments, annealing the film occurs at the same temperature as the forming of the film. In some embodiments, annealing the film occurs at the same temperature and in the same processing chamber as the deposition of the film. For example, a section of a spatial ALD processing chamber can be configured to anneal the film so that the film can be deposited and annealed in a continuous process.

Deposition of the nucleation layer and the cobalt film can occur at any suitable temperature. In some embodiments, the temperature is in the range of about 80° C. to about 150° C. In some embodiments, the temperature of the deposition is less than or equal to about 150, 140, 130, 120, 110 or 100° C.

After deposition of the cobalt film 40, an amount of overburden can be formed on the sides 15 of the stack 12. The overburden can be seen in FIG. 2D. In some embodiments, the overburden 22 is etched from the top 13 and sides 15 of the stack 12 to leave the metal fil 40 in the gaps 14 as wordlines.

After formation of the wordlines, or after etching to remove the overburden, the metal remaining in the gaps 14 as wordlines is substantially even with the sides 15 of the stack 12. As used in this manner, the term "substantially even" means that the wordlines within gaps 14 are within ±1 Å of the side 15 of the stack 12.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of processing a substrate, the method comprising:
   providing a substrate having a stack of spaced oxide layers with gaps between the oxide layers, the stack having a top and sides;
   depositing a metallic nucleation layer in the gaps; and
   depositing a cobalt film on the nucleation layer, the cobalt film filling the gaps and forming wordlines.

2. The method of claim 1, wherein the metallic nucleation layer comprises cobalt.

3. The method of claim 1, wherein the metallic nucleation layer has a thickness in the range of about 30 Å to about 100 Å.

4. The method of claim 1, wherein the metallic nucleation layer is a continuous film.

5. The method of claim 1, further comprising forming a barrier layer on the oxide layers and the nucleation layer is deposited on the barrier layer.

6. The method of claim 5, wherein the barrier layer comprises TiN.

7. The method of claim 1, wherein depositing the metallic nucleation layer comprises exposing the substrate to a first cobalt compound comprising a dicobalt hexacarbonyl acetyl compound and a first reactant to deposit a cobalt layer.

8. The method of claim 7, wherein the first reactant comprises one or more of hydrogen, hydrogen plasmas, alcohols, carboxylic acids, aldehydes, silanes, boranes, ammonia, hydrazine, hydrazine derivatives and combinations thereof.

9. The method of claim 8, wherein the first cobalt compound and the first reactant are exposed sequentially to the substrate.

10. The method of claim 8, wherein the first cobalt compound and the first reactant are exposed to the substrate at the same time.

11. The method of claim 8, wherein the first cobalt compound comprises dicobalt hexacarbonyl butylacetylene (CCTBA).

12. The method of claim 1, wherein depositing the cobalt film comprises exposing the substrate to a second cobalt compound comprising one or more of cobalt tricarbonyl allyl or cobalt tricarbonyl nitrosyl and a second reactant.

13. The method of claim 12, wherein the second reactant comprises one or more of $H_2$, $NH_3$, $H_2$ plasma or $NH_3$ plasma.

14. The method of claim 13, wherein the cobalt film has a deposition rate greater than or equal to about 1 Å per second.

15. The method of claim 1, further comprising annealing the cobalt film.

16. The method of claim 15, wherein annealing the cobalt film occurs in the same processing chamber and temperature as forming the cobalt film.

17. A method of processing a substrate, the method comprising:
   providing a substrate having a stack of spaced silicon oxide layers with gaps between the silicon oxide layers, the stack having a top and sides;
   depositing a continuous cobalt nucleation layer in the gaps; and
   depositing a cobalt film on the nucleation layer, the cobalt film filling the gaps and forming wordlines.

18. The method of claim 17, wherein depositing the cobalt nucleation layer comprises exposing the substrate to a first cobalt compound comprising dicobalt hexacarbonyl butylacetylene and a first reactant comprising one or more of hydrogen, hydrogen plasmas, alcohols, carboxylic acids, aldehydes, silanes, boranes, ammonia, hydrazine, hydrazine derivatives and combinations thereof to deposit a cobalt layer.

19. The method of claim 17, wherein depositing the cobalt film comprises exposing the substrate to a second cobalt compound comprising one or more of cobalt tricarbonyl allyl or cobalt tricarbonyl nitrosyl and a second reactant comprising one or more of $H_2$, $NH_3$, $H_2$ plasma or $NH_3$ plasma.

20. A method of processing a substrate, the method comprising:
   providing a substrate having a stack of spaced silicon oxide layers with gaps between the silicon oxide layers, the stack having a top and sides;
   forming a barrier layer on the silicon oxide layers, the barrier layer comprising TiN;
   depositing a continuous cobalt nucleation layer in the gaps on the barrier layer, wherein depositing the metallic nucleation layer comprises exposing the substrate to a first cobalt compound comprising dicobalt hexacarbonyl butylacetylene and a first reactant comprising one or more of hydrogen, hydrogen plasmas, alcohols, carboxylic acids, aldehydes, silanes, boranes, ammonia, hydrazine, hydrazine derivatives and combinations thereoto deposit a cobalt layer; and
   depositing a cobalt film on the cobalt nucleation layer, the cobalt film filling the gaps and forming wordlines, wherein depositing the cobalt film comprises exposing the substrate to a second cobalt compound comprising one or more of cobalt tricarbonyl allyl or cobalt tricarbonyl nitrosyl and a second reactant comprising one or more of $H_2$, $NH_3$, $H_2$ plasma or $NH_3$ plasma.

\* \* \* \* \*

UNITED STATES PATENT AND TRADEMARK OFFICE
CERTIFICATE OF CORRECTION

| | |
|---|---|
| PATENT NO. | : 10,559,578 B2 |
| APPLICATION NO. | : 15/995693 |
| DATED | : February 11, 2020 |
| INVENTOR(S) | : Jacqueline S. Wrench et al. |

Page 1 of 1

It is certified that error appears in the above-identified patent and that said Letters Patent is hereby corrected as shown below:

In the Specification

In Column 5, Line 44, replace "fil" with "film".

In the Claims

In Claim 20, Column 7, Line 20, replace "thereoto" with "thereof to".

Signed and Sealed this
Fifth Day of May, 2020

Andrei Iancu
*Director of the United States Patent and Trademark Office*